(12) United States Patent
Sarode Vishwanath et al.

(10) Patent No.: US 12,002,703 B2
(45) Date of Patent: Jun. 4, 2024

(54) LIFT PIN ASSEMBLY

(71) Applicant: Applied Materials, Inc., Santa Clara, CA (US)

(72) Inventors: Yogananda Sarode Vishwanath, Bangalore (IN); Anand Kumar, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 173 days.

(21) Appl. No.: 17/227,066

(22) Filed: Apr. 9, 2021

(65) Prior Publication Data

US 2021/0233799 A1    Jul. 29, 2021

Related U.S. Application Data

(62) Division of application No. 16/010,250, filed on Jun. 15, 2018, now Pat. No. 11,004,722.

(30) Foreign Application Priority Data

Jul. 20, 2017    (IN) .............................. 201741025813

(51) Int. Cl.
*H01L 21/687*    (2006.01)
*C23C 16/44*    (2006.01)
(Continued)

(52) U.S. Cl.
CPC .... *H01L 21/68742* (2013.01); *C23C 16/4401* (2013.01); *H01J 37/32715* (2013.01);
(Continued)

(58) Field of Classification Search
CPC ...................... H01L 21/68742; C23C 16/4401
See application file for complete search history.

(56) References Cited

U.S. PATENT DOCUMENTS 5,879,459 A    3/1999 Gadgil et al.
6,148,762 A    11/2000 Fukuda et al.
(Continued)

FOREIGN PATENT DOCUMENTS

CN    113062896    *    7/2021
KR    101053564 B1    *    8/2011
(Continued)

OTHER PUBLICATIONS

KR20230101672 A; Lee Sang Kee; Korea (Year: 2022).*
(Continued)

*Primary Examiner* — Mahdi H Nejad
(74) *Attorney, Agent, or Firm* — Chad M. Dougherty; PATTERSON + SHERIDAN, LLP

(57) ABSTRACT

Apparatuses for substrate transfer are provided. A lift pin assembly can include a lift pin, a purge cylinder, and a lift pin guide. The lift pin guide is disposed adjacent the purge cylinder. The lift pin guide and the purge cylinder have a passage formed therethrough in which the lift pin is disposed. The purge cylinder includes one or more nozzles that direct the flow of gas radially inward into a portion of the passage disposed in the purge cylinder. The one or more nozzles are disposed radially outward from the lift pin. The purge cylinder reduces particle deposition on the substrate by preventing contact between the lift pin and the support assembly as the lift pin is in motion.

20 Claims, 4 Drawing Sheets

(51) Int. Cl.
  *H01J 37/32* (2006.01)
  *H01L 21/67* (2006.01)
  *H01L 21/683* (2006.01)
(52) U.S. Cl.
  CPC .. *H01L 21/67017* (2013.01); *H01L 21/67103* (2013.01); *H01L 21/67109* (2013.01); *H01L 21/6831* (2013.01); *H01L 21/6833* (2013.01); *H01L 21/68757* (2013.01); *H01L 21/68785* (2013.01); *H01J 37/32449* (2013.01); *H01L 21/67069* (2013.01)

(56) References Cited

U.S. PATENT DOCUMENTS

| | | |
|---|---|---|
| 6,174,377 B1 | 1/2001 | Doering et al. |
| 6,288,465 B1 | 9/2001 | Suzuki et al. |
| 6,387,185 B2 | 5/2002 | Doering et al. |
| 6,478,872 B1 | 11/2002 | Chae et al. |
| 6,849,241 B2 | 2/2005 | Dauelsberg et al. |
| 6,916,398 B2 | 7/2005 | Chen et al. |
| 6,991,934 B2 | 1/2006 | Walton et al. |
| 7,292,428 B2 | 11/2007 | Hanawa et al. |
| 7,375,946 B2 | 5/2008 | White et al. |
| 7,428,550 B2 | 9/2008 | Lakshminarayan et al. |
| 7,780,788 B2 | 8/2010 | Chen et al. |
| 8,216,422 B2 | 7/2012 | Kurita et al. |
| 8,313,612 B2 | 11/2012 | McMillin et al. |
| 8,668,776 B2 | 3/2014 | Chen et al. |
| 9,218,944 B2 | 12/2015 | Chandrachood et al. |
| 9,279,185 B2 * | 3/2016 | Li ................... C23C 16/45589 |
| 9,349,589 B2 | 5/2016 | Enomoto et al. |
| 9,388,494 B2 | 7/2016 | Xia et al. |
| 9,553,002 B2 * | 1/2017 | Samir ............... H01L 21/67115 |
| 9,914,999 B2 * | 3/2018 | Rasheed ............ C23C 16/4404 |
| 9,991,153 B2 | 6/2018 | Hou |
| 10,340,174 B2 | 7/2019 | Yamaguchi et al. |
| 10,407,771 B2 * | 9/2019 | Cui ................... H01J 37/32357 |
| 11,634,817 B2 * | 4/2023 | Gomm ............... C23C 16/4586 156/286 |
| 2002/0011204 A1 | 1/2002 | Gujer et al. |
| 2003/0000775 A1 | 1/2003 | Yudovsky et al. |
| 2003/0178145 A1 | 9/2003 | Anderson et al. |
| 2004/0182316 A1 | 9/2004 | Watanabe |
| 2004/0219006 A1 | 11/2004 | Tran et al. |
| 2005/0194100 A1 | 9/2005 | Or et al. |
| 2005/0217586 A1 | 10/2005 | Lubomirsky et al. |
| 2009/0155025 A1 | 6/2009 | Lerner et al. |
| 2009/0266840 A1 * | 10/2009 | Brand ..................... F04B 13/00 222/145.5 |
| 2009/0314211 A1 | 12/2009 | Du Bois et al. |
| 2010/0013626 A1 | 1/2010 | Park et al. |
| 2011/0033620 A1 | 2/2011 | Polyak et al. |
| 2013/0001899 A1 | 1/2013 | Hwang et al. |
| 2014/0202635 A1 * | 7/2014 | Yamaguchi ......... H01L 21/6831 279/128 |
| 2014/0265090 A1 | 9/2014 | Hou |
| 2014/0265097 A1 | 9/2014 | Cuvalci et al. |
| 2016/0083837 A1 | 3/2016 | Narushima et al. |
| 2016/0138375 A1 | 5/2016 | Tanner et al. |
| 2018/0012733 A1 * | 1/2018 | Phillips ............ C23C 16/45565 |
| 2018/0114716 A1 | 4/2018 | Hao et al. |
| 2018/0166259 A1 | 6/2018 | Ueda |
| 2019/0027394 A1 | 1/2019 | Sarode Vishwanath et al. |

FOREIGN PATENT DOCUMENTS

| | | | |
|---|---|---|---|
| KR | 20130016837 | * | 2/2013 |
| KR | 20130016837 A | * | 2/2013 |

OTHER PUBLICATIONS

CN 100367485 C; Asakura K; China (Year: 2004).*
KR 20100078391 A; Jung Sung Kyung; Korea (Year: 2010).*
KR 20120134368 A; Kim Young Hak; Korea (Year: 2012).*
KR 20130016837 A; Kim Min Sang; Korea (Year: 2013).*
Substrate Processing Device, Reaction Tube, Manufacturing Method and Program for Semiconductor Device; Document ID: CN 110121764 A; Date Published: Aug. 13, 2019; Inventor Name: Nishinodo Suhei, Sasaki Takafumi, Yoshida Hidenori, Okajima Yusaku; Date Published: Aug. 13, 2019 (Year: 2019).*
Susceptor Used In Vapor Phase Growth Device, Has Multiple Jack Holes Penetrating Bottom Portion, and Opening That Is In Communication With One Top Rod Hole Through Hollow Passage; Document ID: CN 109306468 A; Inventor Name: Xiao D; Date Published: Feb. 5, 2019 (Year: 2019).*
Gas Phase Growth Device And Gas Phase Growth Method; Document ID: CN 109306467 B; Inventor Name: Xiao, De-yuan ; Date Published: 2020-10-16; Date Filed: 2017-07-26 (Year: 2020).*

* cited by examiner

LIFT PIN ASSEMBLY

CROSS-REFERENCE TO RELATED APPLICATIONS

This application is a divisional of U.S. patent application Ser. No. 16/010,250, filed Jun. 15, 2018, which claims benefit of Indian Pat. Appl. No. 201741025813, filed Jul. 20, 2017, which are herein incorporated by reference in their entirety.

BACKGROUND

Field

Embodiments described herein generally relate to apparatus for reducing particle deposition, and more particularly to apparatus for substrate transfer.

Description of the Related Art

Processing chambers generally capable of processing 300 mm substrates transport and support the substrate by a lift pin assembly. Such lift pin assembly can be used for temporarily supporting the substrates during transfer, thermal, chemical, optical and other treatments of the substrate. In order to transfer a substrate into a substrate processing chamber, it is conventional to utilize a robot arm and lift pin assembly. Specifically, a substrate is supported by three pins dispersed about 120 degrees apart and projecting from a lifter ring. The lift pins form part of a substrate support assembly and is movable in a vertical direction between upper and lower positions. The lifter ring is movable such that the lift pins have an upper surface located above the substrate support surface of the substrate holder when the lifter is in the upper position. Furthermore, the upper surface of the lift pin is below the substrate support surface when the lifter ring is in the lower position. Thus, part of each lift pin passes through a respective lift pin hole in the substrate support when the lifter ring moves from either the lower position to the upper position.

One problem that has been observed is that the lift pins may bind as they pass through the lift pin holes in the substrate support. Another problem is that as the pin passes through the lifter ring, the two components can touch generating particles as that are deposited on the substrate.

Therefore, there is a need in the art for a lift pin assembly.

SUMMARY

Embodiments described herein generally relate to apparatus for reducing particle deposition, and more particularly to apparatus for substrate transfer. In one embodiment, the apparatus includes a lift pin, a purge cylinder, and a lift pin guide. The lift pin guide is disposed adjacent the purge cylinder. The lift pin guide and the purge cylinder have a passage formed therethrough in which the lift pin is disposed. The purge cylinder includes one or more nozzles that direct the flow of gas radially inward into a portion of the passage disposed in the purge cylinder. The one or more nozzles are disposed radially outward from the lift pin.

In another embodiment, a lift pin assembly is disclosed. The lift pin assembly includes a purge cylinder, a lift pin guide, and a bushing. The purge cylinder is disposed adjacent the lift pin guide. The lift pin guide and the purge cylinder have a passage formed therethrough. The purge cylinder includes one or more nozzles configured to direct a flow of gas radially inward into a portion of the passage disposed in the purge cylinder. The lift pin guide is disposed between the purge cylinder and the bushing.

In another embodiment, a support assembly is disclosed. The support assembly includes a substrate support, a facility plate disposed below the substrate support, and a lift pin assembly disposed within the substrate support and the facility plate. The lift pin assembly includes a lift pin, a purge cylinder, and a lift pin guide. The lift pin guide is disposed adjacent the purge cylinder. The lift pin guide and the purge cylinder have a passage formed therethrough in which the lift pin is disposed. The purge cylinder includes one or more nozzles configured to direct a flow of gas radially inward into a portion of the passage disposed in the purge cylinder. The one or more nozzles are disposed radially outward from the lift pin.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to apparatus for reducing particle deposition, and more particularly to apparatus for substrate transfer. In one embodiment, the apparatus includes a lift pin, a purge cylinder, and a lift pin guide. The lift pin guide is disposed adjacent the purge cylinder. The lift pin guide and the purge cylinder have a passage formed therethrough in which the lift pin is disposed. The purge cylinder includes one or more nozzles that direct the flow of gas radially inward into a portion of the passage disposed in the purge cylinder. The one or more nozzles are disposed radially outward from the lift pin. The purge cylinder reduces particle deposition on the substrate by preventing contact between the lift pin and the support assembly as the lift pin is in motion. The purge cylinder creates an air bearing and reduces particle deposition on the substrate by preventing contact between the lift pin and the support assembly as the lift pin is in motion.

Figure 1:
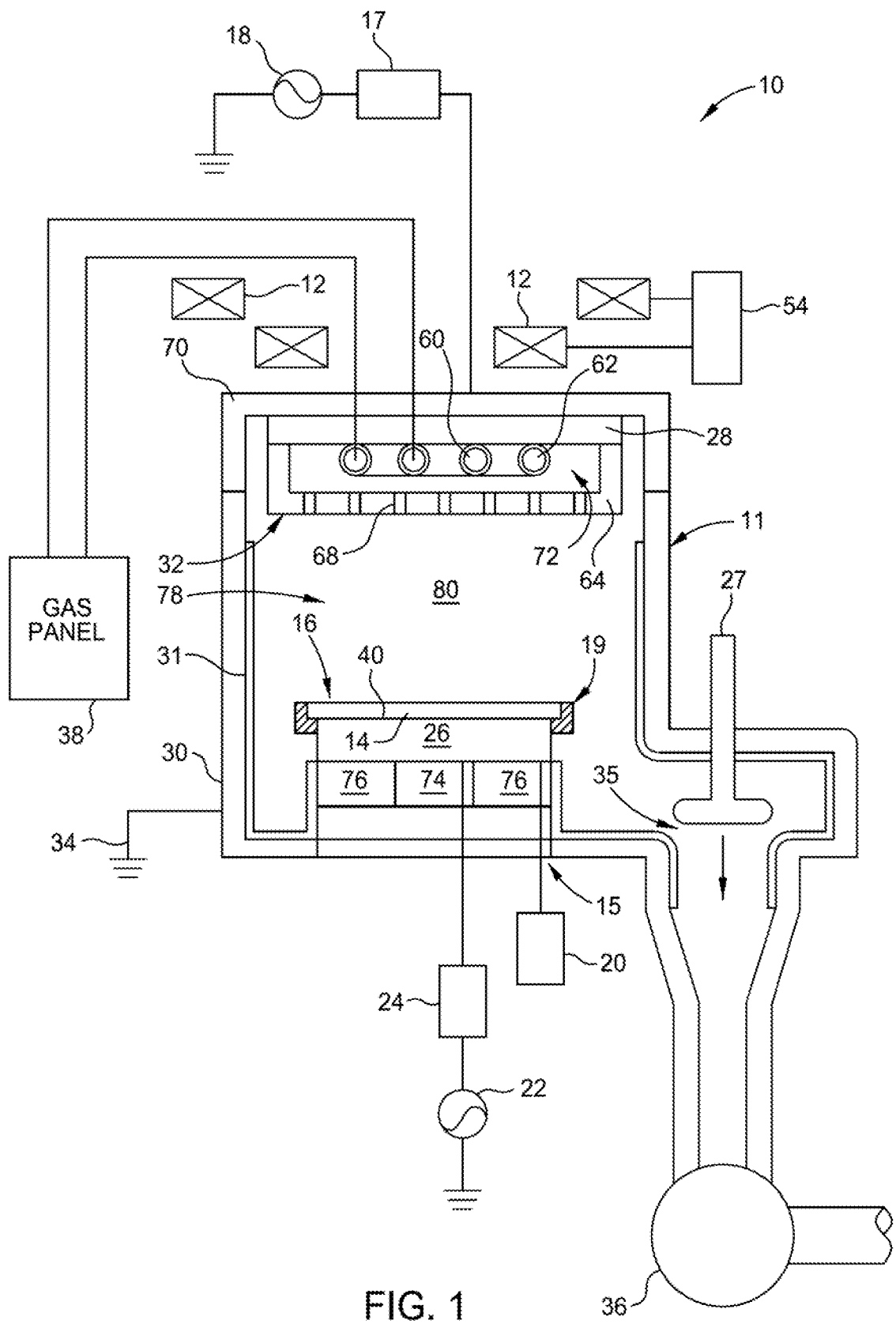
FIG. 1 shows a cross-sectional view of an exemplary process chamber that may benefit from embodiments discussed and described herein.

FIG. 1 shows a cross-sectional view of a process chamber 10, such as a plasma etch chamber, that may benefit from embodiments discussed and described herein. The process chamber 10 includes a vacuum chamber body 11 having a conductive chamber wall 30 and bottom 15. The chamber wall 30 is connected to an electrical ground 34. A lid 70 is disposed on the chamber wall 30 to enclose an interior volume 78 defined within the chamber body 11. One or more solenoid segments 12 are positioned exterior to the chamber wall 30. The solenoid segments 12 may be selectively energized by a DC power source 54 that is capable of producing at least 5 V to provide a control knob for plasma processes formed within the process chamber 10.

A liner 31 is disposed within the interior volume 78 to facilitate cleaning of the process chamber 10. The byproducts and residue of the etch process may be readily removed from the liner 31 at selected intervals. A substrate support pedestal 16 is disposed on the bottom 15 of the process chamber 10 below the gas diffuser 32. A process region 80 is defined within the interior volume 78 between the substrate support pedestal 16 and a diffuser 32. The substrate support pedestal 16 may include an electrostatic chuck 26 for retaining a substrate 14 on a surface 40 of the substrate support pedestal 16 beneath the gas diffuser 32 during processing. The electrostatic chuck 26 is controlled by a DC power supply 20.

In one embodiment, a cover ring 19 is disposed around an outer perimeter of the substrate support pedestal 16 as well as the substrate 14. In one embodiment, the cover ring 19 is contains a quartz material having yttrium element doped therein. The yttrium doped cover ring 19 exhibits improved corrosion resistance compared to other parts fabricated using conventional processes, and as such, protect the substrate support pedestal 16 from damage during substrate processing. The substrate support pedestal 16 may be coupled to an RF bias source 22 through a matching network 24. The bias source 22 is generally capable of producing an RF signal having a tunable frequency of 2 kHz to 13.56 MHz and a power of between about 0 and about 5,000 watts. Optionally, the bias source 22 may be a DC or pulsed DC source. The substrate support pedestal 16 may also include inner and outer temperature regulating zones 74, 76. Each zone 74, 76 may include at least one temperature regulating device, such as a resistive heater or a conduit for circulating coolant, so that the radial temperature gradient of the substrate disposed on the pedestal may be controlled.

The interior of the process chamber 10 is a high vacuum vessel that is coupled to a vacuum pump 36 through an exhaust port 35 formed through the chamber wall 30 and/or chamber bottom 15. A throttle valve 27 disposed in the exhaust port 35 is used in conjunction with the vacuum pump 36 to control the pressure inside the process chamber 10. The position of the exhaust port 35 and other flow restrictions within the interior volume 78 of the chamber body 11 greatly influence the conductance and gas flow distribution within the processing chamber 10.

The gas diffuser 32 provides a conduit through which at least one process gas is introduced into the processing region 80. In one embodiment, the gas diffuser 32 may provide process gases to the region 80 in an asymmetrical manner that may be used to tune the conductance and gas flow distribution described above that are caused by the other chamber components (e.g., location of the exhaust port, geometry of the substrate support pedestal or other chamber component) so that the flow of gases and species are delivered to the substrate in a uniform, or selected, distribution.

In one embodiment illustratively depicted in FIG. 1, the gas diffuser 32 includes at least two gas distributors 60, 62, a mounting plate 28 and a gas distribution plate 64. The gas distributors 60, 62 are coupled to one or more gas panels 38 through the lid 70 of the process chamber 10, and are also coupled to at least one of the mounting or gas distribution plates 28, 64. The flow of gas through the gas distributors 60, 62 may be independently controlled. Although the gas distributors 60, 62 are shown coupled to a single gas panel 38, it is contemplated that the gas distributors 60, 62 may be coupled to one or more shared and/or separate gas sources. Gases provided from the gas panel 38 are delivered into a region 72 defined between the plates 28, 64, then exit through a plurality of apertures 68 formed through the gas distribution plate 64 into the processing region 80.

The mounting plate 28 is coupled to the lid 70 opposite the substrate support pedestal 16. The mounting plate 28, which is fabricated from or covered by an RF conductive material, is coupled to an RF source 18 through an impedance transformer 17 (e.g., a quarter wavelength matching stub). The source 18 is generally capable of producing an RF signal having a tunable frequency between about 60 MHz and about 62 MHz and a power between about 0 and about 3,000 watts. The mounting plate 28 and/or gas distribution plate 64 is powered by the RF source 18 to maintain a plasma formed from the process gases in the process region 80.

Figure 2:
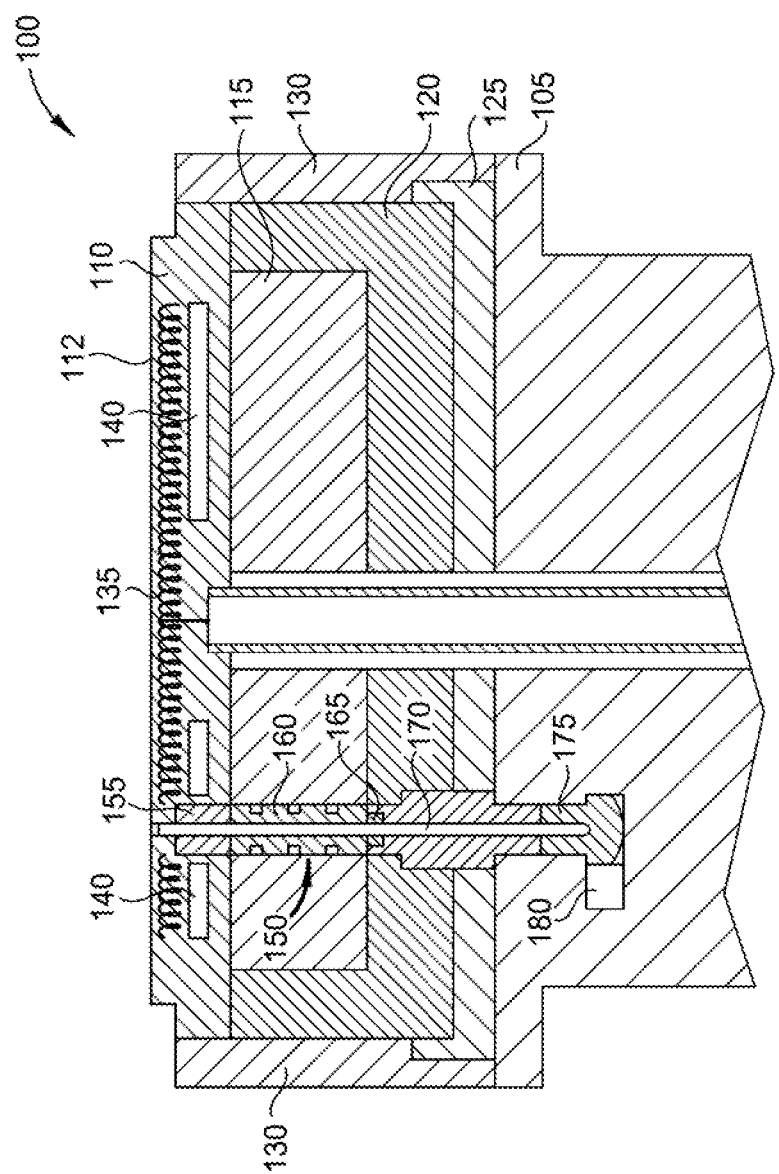
FIG. 2 shows a cross-sectional view of a support assembly according to one embodiment described herein.

FIG. 2 shows a cross-sectional view of a substrate support assembly 100. The support assembly 100 is disposed on a support platform 105. The support assembly 100 includes a substrate support 110, a facility plate 115, an insulating plate 120, a connecting plate 125, a body 130, and a plurality of lift pin assemblies 150.

The substrate support 110 includes a support surface 112 on which the substrate is processed. The substrate support 110 may be a susceptor, a heater, electrostatic chuck or other workpiece support on which the substrate is disposed during processing, for example, within a semiconductor vacuum processing chamber. In one implementation, the substrate support 110 includes a ceramic puck 236 disposed over a cooling base 246. The puck 236 includes at least one electrode 135 for electrostatically chucking the substrate to the support surface 112. The cooling base 246 includes cooling channels 140 embedded within the substrate support 110 below the puck 236 for regulating the temperature of the puck 236 and substrate disposed thereon. In one or more embodiments, the puck 236 may be fabricated from or contain one or more ceramic materials, such as alumina. The electrode 135 is electrically coupled to a remote power source, such as a high voltage DC (HVDC) power supply (not shown) to chuck a substrate. In one embodiment, the electrodes 135 may be utilized to provide a bias voltage to the substrate being processed on the substrate support 110.

The facility plate 115 is disposed between the substrate support 110 and the insulating plate 120. The facility plate 115 is fabricated from one or more ceramic materials and/or one or more materials containing aluminum or alloys thereof. The insulating plate 120 is disposed between the facility plate 115 and the connecting plate 125. The insulating plate 120 is fabricated from a ceramic material, such as Ultem polyetherimide or Rexolite, commercially available. The connecting plate 125 is disposed on the support platform 105.

The plurality of lift pin assemblies 150 is disposed within the support assembly 100. In one or more embodiments, the plurality of lift pin assemblies 150 are spaced circumferentially around the center of the support assembly 100. The lift pins 170 are used to raise a substrate from the substrate support 110 such that a blade of a robot (not shown) used to transfer the substrate may access the underside of the substrate and facilitate transfer of the substrate. Each lift pin assembly 150 includes a lift pin guide 155, a bushing 165, a purge cylinder 160, the lift pin 170, and a hoop assembly 175.

Figure 3A:
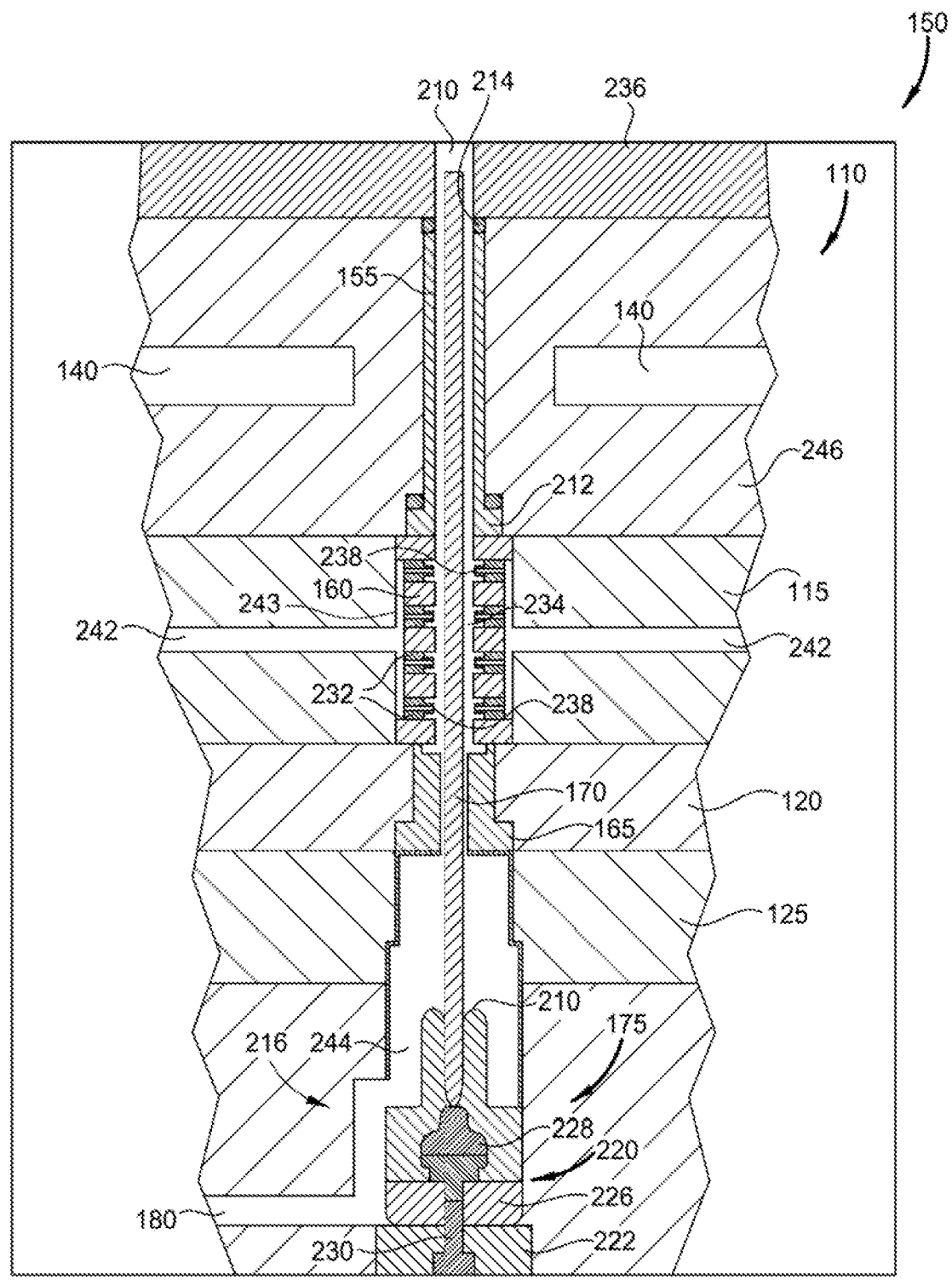
FIG. 3A shows a cross-sectional view of a lift pin assembly according to one embodiment described herein.

FIG. 3A shows a cross-sectional view of one example of the lift pin assembly 150. The lift pin guide 155 is disposed in a portion of a lift pin hole 210 that passes through the cooling base 246. The substrate support 110 has additional lift pin holes 210 not shown in FIG. 3A to accommodate the other lift pin assemblies 150. In one or more embodiments, the substrate support 110 has three lift pin holes 210 that accommodate three lift pin assemblies 150. The lift pin holes 210 extend through the support platform 105 with the lower end of the lift pin holes 210 fluidly connecting with an exhaust passage 180. The lift pin 170 extends through the lift pin guide 155, the bushing 165, the purge cylinder 160, and into the hoop assembly 175. The lift pin guide 155 includes a larger diameter end 212 to retain the lift pin guide 155 within the support assembly 100 upon assembly of the substrate support 110. The lift pin guide 155 guides, e.g., provides a bearing surface, the lift pin 170 when the lift pin 170 is extended through the support surface 112 and retracted into the substrate support 110. The lift pin 170 may be made from one or more ceramic materials with high strength, such as sapphire or other suitable materials. In one or more embodiments, the lift pin guide 155 is fabricated from or contains one or more ceramic materials, such as alumina.

The lift pin guide 155 is disposed in the lift pin hole 210 formed adjacent the cooling channels 140 that are disposed within the substrate support 110. The cooling channels 140 limit the relative difference in thermal expansion between the lift pin 170 and the substrate support 110. The lift pin guide 155 surrounds the lift pin 170 and is disposed adjacent the purge cylinder 160. In one implementation, the larger diameter end 212 of the lift pin guide 155 is adjacent the purge cylinder 160. The lift pin guide 155 is fabricated from a ceramic material such as alumina, or other suitable material. In one or more embodiments, the lift pin guide 155 is in the form of an elongated cylinder that has a length from about 1 inch to 2 inches.

An O-ring 214 adjacent the lift pin guide 155. In one or more embodiments, the O-ring 214 is fabricated from a fluoropolymer or other material compatible with the processing environment. In other embodiments, the O-ring 214 is disposed between the cooling base 246, the lift pin guide 155, and the ceramic puck 236, and substantially prevents vertical movement of the lift pin guide 155. The O-ring 214 is disposed radially outward of the lift pin holes 210. In one embodiment, the O-ring 214 may be disposed on the larger diameter end 212 of the lift pin guide 155. In another implementation, more than one O-ring may be disposed in contact with the lift pin guide 155.

The hoop assembly 175 includes a connector 216 having a first end 218 and a second end 220, an actuator arm 230, and an actuator 222. The hoop assembly 175 is disposed in the portion of a lift pin hole 210 that passes through the support platform 105. The second end 220 is opposite of and has a larger diameter than the first end 218. The lift pin 170 engages, for example snap fits into, the first end 218 of the connector 216. In other words, the connector 216 has an elongated portion that surrounds the end of the lift pin 170. The second end 220 is connected to a second bushing 226 and actuator 222 through a pad 228 and actuator arm 230. In operation, the actuator 222 displaces the lift pin 170 of the lift pin assembly 150 within the substrate support assembly 100. The pad 228 is in contact with the lift pin 170 and the actuator arm 230.

In another embodiment, not illustrated in the Figures, the hoop assembly 175 can be replaced with a moveable support system outside of the support assembly 100 such that each of the lift pins 170 is coupled to an independent bellow. For example, the support assembly 100 includes three lift pins 170 and three bellows or four lift pins 170 and four bellows, such that each lift pin is coupled to a bellow. An actuator or other motor-driven device control movement of a support bracket that supports the bellow.

The purge cylinder 160 is disposed in the portion of the lift pin hole 210 that passes through the facility plate 115. The purge cylinder 160 has a plurality of nozzles 232. In one implementation, the purge cylinder 160 has between 4 and 6 nozzles 232. Each nozzle 232 has an outer diameter of about 20 mil (about 0.51 mm) to about 80 mil (about 2.03 mm). The nozzles 232 direct the flow of gas towards the lift pin 170. The nozzles 232 are disposed vertically within the purge cylinder 160 such that flows of fluid exiting the nozzles 232 are arranged on parallel planes. In operation, the direction of the fluid flowing out of each nozzle 232 is substantially parallel to one another. In one implementation, the nozzles 232 are disposed vertically within the purge cylinder 160 in a staggered pattern. Each nozzle 232 may be on a different transverse plane. In other words, nozzles 232 on opposite sides of the purge cylinder 160 are on different transverse planes. For example, a first nozzle on one side of the purge cylinder 160 may have a second nozzle on a second side of the purge cylinder above the first nozzle and a third nozzle on the second side of the purge cylinder below the first nozzle but will not have a directly opposing nozzle. In another example, the groups of nozzles 232 may be arranged on different transverse planes, with nozzles within a common plane all directing flow inwards towards the lift pin 170.

Each nozzle 232 has an inlet 238 that in operation directs pressurized clean dry air or other suitable fluid towards the lift pin 170. In one implementation, the nozzles 232 direct a stream of gas, such as nitrogen ($N_2$), air, or other inert gas, towards the lift pin 170 to create an air bearing that substantially reduces the amount of contact between the lift pin 170 and other components of the lift pin assembly 150. Each nozzle 232 is connected to a conduit 242 that extends into the facility plate 115 to supply the nozzle 232 with fluid, for example clean dry air or nitrogen. The conduit 242 is in fluid connection with a circumferential plenum 243. The circumferential plenum 243 provides for equal pressure flow distribution through each nozzle 232. The circumferential plenum 243 is in fluid connection with the conduit 242 and each nozzle 232. Each conduit 242 is on the opposite side of each inlet 238. In one implementation, the nozzles 232 are disposed circumferentially around the lift pin 170. For example, nozzles 232 on the same transverse plane may be separated by an angle of about 120 degrees to about 180 degrees. The nozzles 232 may alternatively be configured as a porous material that allows fluid to flow radially inward towards the lift pin 170.

In operation, the purge cylinder 160 injects a fluid into a portion of the space 234 between the lift pin 170 and the nozzles 232 creating an air bearing. The fluid is injected substantially perpendicular to the lift pin 170, after which the injected fluid is directed towards the opening and bottom 244 of the lift pin hole 210 along the surface of the lift pin 170. In other words, the fluid flow is perpendicular towards the lift pin 170 and then vertical along the lift pin 170. As the lift pin 170 is raised or lowered, the fluid provides a low friction load bearing surface that facilitates substantially contact-free movement of the lift pin 170 so that particle generation is substantially eliminated. The fluid travels up towards the substrate and down towards the actuator 222. The fluid is evacuated from the space 234 through the bottom 244 of the lift pin hole 210 disposed adjacent the actuator 222. The space 234 extends between the lift pin 170 and the lift pin guide 155 and between the lift pin 170 and the bushing 165. The bottom 244 disposed adjacent the actuator 222 is in fluid connection with the exhaust passage 180. The purge cylinder 160 creates an air bearing and directs pressurized fluid into the hole 210 that surrounds the lift pin 170 circumferentially. In other words, air bearing provided by the fluid directed into the hole 210 surrounding the lift pin 170 allows the lift pin 170 to move up and down substantially without contact to either the purge cylinder 160 or the lift pin guide 155. As the lift pin 170 moves, the pressure from the fluid generated by the purge cylinder 160 reduces friction between the lift pin 170 and the surrounding parts and substantially maintains a contact free system. Additionally, the fluid that exits the bottom 244 of the lift pin hole 210 drives any particles away from the back-side of the substrate substantially preventing particle contamination on the substrate.

Figure 3B:
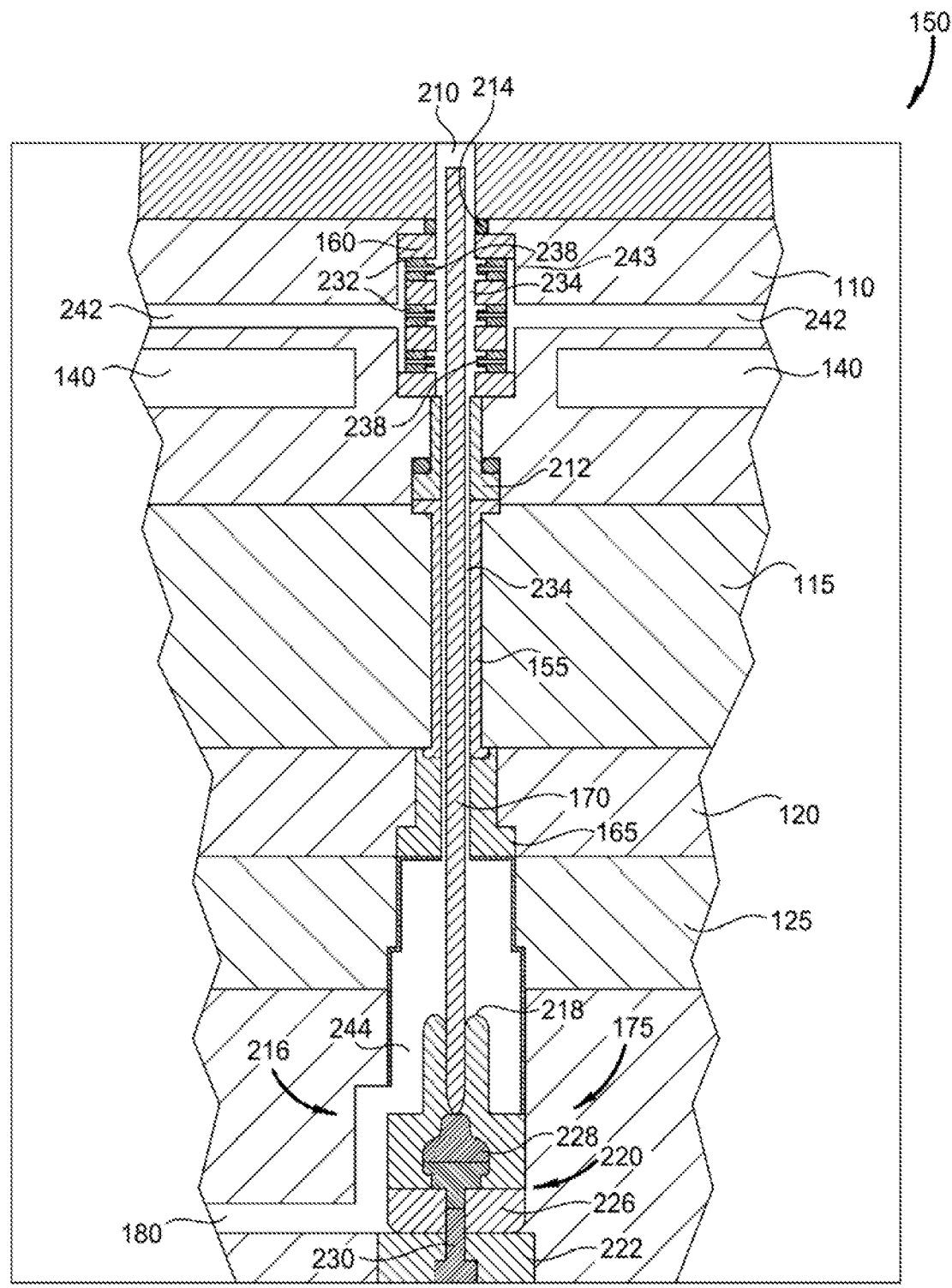
FIG. 3B shows a cross-sectional view of a lift pin assembly according to one embodiment described herein.

FIG. 3B shows a cross-sectional view of another example of a lift pin assembly 150. The lift pin guide 155 is disposed in the portion of a lift pin hole 210 that passes through the substrate support 110 as well as the facility plate 115. In one implementation, the lift pin guide 155 may be machined as several pieces that are connected together, for example by welds or fasteners. In another implementation the lift pin guide 155 is monolithic or fabricated as a single piece. The lift pin guide 155 may have an end 240 that connects with the bushing 165. In one implementation, the end 240 of the lift pin guide 155 connects to a complementary indent of the bushing 165. A portion of the lift pin guide 155 is adjacent the cooling channels 140 that are disposed within the substrate support 110. The lift pin guide 155 surrounds the lift pin 170 and is disposed adjacent the purge cylinder 160. In other words, the lift pin 170 is disposed in a lift pin hole 210 and extends through the lift pin guide 155. In one implementation, the lift pin guide 155 has several protrusions to help retain the lift pin guide 155 within the support assembly 100. The lift pin guide 155 is fabricated from one or more ceramic materials, such as alumina. In one or more examples, the lift pin guide 155 has a length of about 1 inch to about 4 inches.

The purge cylinder 160 is disposed in the portion of the lift pin hole 210 that passes through the substrate support 110. The purge cylinder 160 has a plurality of nozzles 232. In one implementation, the purge cylinder 160 has between 4 and 6 nozzles 232. Each nozzle 232 has an outer diameter between 20-80 mil. The nozzles 232 direct the flow of gas towards the lift pin 170. The nozzles 232 are disposed vertically within the purge cylinder 160 such that the nozzles 232 are parallel to one another. In one implementation, the nozzles 232 are disposed vertically within the purge cylinder 160 in a staggered pattern. Each nozzle 232 has an inlet that in operation directs pressurized clean dry air towards the lift pin 170. In one implementation, the nozzles 232 direct nitrogen ($N_2$) towards the lift pin 170. Each nozzle 232 is connected to a conduit 242 that extends into the substrate support 110 to supply the nozzle 232 with fluid, for example clean dry air or nitrogen. Each conduit is on the opposite side of each inlet. FIG. 3B shows two conduits 242. In one implementation, the nozzles 232 are connected to one conduit that extends into the substrate support 110. In one implementation, the conduit 242 is disposed in the cooling base 246. The conduit 242 is in fluid connection with the circumferential plenum 243. The circumferential plenum 243 provides for equal pressure flow distribution through each nozzle 232. The circumferential plenum 243 is in fluid connection with the conduit 242 and each nozzle 232. In one implementation, the purge cylinder 160 is adjacent the cooling channels 140 that are disposed within the substrate support 110.

An O-ring 214 is disposed above the purge cylinder 160. In one implementation, the O-ring 214 is disposed between the purge cylinder 160, the lift pin guide 155, and the ceramic puck 236 preventing the vertical movement of the purge cylinder 160. The O-ring 214 is disposed radially outward of the lift pin holes 210.

In operation, the purge cylinder 160 injects a fluid into the space 234 between the lift pin 170 and the nozzles 232. As the lift pin 170 is raised or lowered, the fluid provides for smooth movement of the lift pin 170 without particle generation. The fluid travels up towards the substrate and down towards the actuator 222. The fluid is evacuated from the space 234 through the bottom 244 of the lift pin hole 210 disposed adjacent the actuator 222. The space 234 extends between the lift pin 170 and the lift pin guide 155 and between the lift pin 170 and the bushing 165. The bottom 244 disposed adjacent the actuator 222 is in fluid connection with the exhaust passage 180. The purge cylinder 160 creates an air bearing and directs pressurized fluid into the hole 210 that surrounds the lift pin 170 circumferentially. In other words, air bearing provided by the fluid directed into the hole 210 surrounding the lift pin 170 allows the lift pin 170 to move up and down substantially without contact to either the purge cylinder 160 or the lift pin guide 155. As the lift pin 170 moves, the pressure from the fluid generated by the purge cylinder 160 reduces friction between the lift pin 170 and the surrounding parts and substantially maintains a contact free system. Additionally, the fluid that exits the bottom 244 of the lift pin hole 210 drives any particles away from the back-side of the substrate substantially preventing particle contamination on the substrate.

The purge cylinder 160 injects fluid that provides a path the lift pin 170 travels through. The fluid surrounds the lift pin 170 as the lift pin 170 moves up and down. The purge cylinder 160 reduces particle deposition on the substrate by preventing contact between the lift pin 170 and the support assembly 100 as the lift pin 170 is in motion. Additionally, the purge cylinder 160 evacuates particles that may exist in the support assembly by evacuating the particles away from the back of the substrate as well as towards the exhaust passage 180.

While the foregoing is directed to embodiments of the disclosure, other and further embodiments may be devised without departing from the basic scope thereof, and the scope thereof is determined by the claims that follow.

What is claimed is:

1. A lift pin assembly comprising:
   a lift pin guide;
   a purge cylinder disposed adjacent the lift pin guide, the lift pin guide and the purge cylinder having a passage formed therethrough that is configured to receive a lift pin suitable for lifting a substrate, wherein the purge cylinder comprises:
   a plurality of nozzles configured to direct a flow of gas radially inward into a portion of the passage disposed in the purge cylinder that receives the lift pin, each nozzle included in the plurality of nozzles having an outer diameter of about 20 mil to about 80 mil; and
   a bushing, wherein the lift pin guide is disposed between the purge cylinder and the bushing.

2. The lift pin assembly of claim 1, wherein the purge cylinder is a ceramic material.

3. The lift pin assembly of claim 1, wherein the lift pin guide is disposed below the purge cylinder.

4. The lift pin assembly of claim 1, further comprising the lift pin disposed in the passage.

5. The lift pin assembly of claim 4, wherein the plurality of nozzles are disposed radially outward from the lift pin.

6. The lift pin assembly of claim 4, wherein the lift pin is fabricated from sapphire.

7. The lift pin assembly of claim 4, wherein the plurality of nozzles are disposed in a staggered pattern surrounding the lift pin.

8. The lift pin assembly of claim 4, wherein the plurality of nozzles comprise at least two nozzles that are disposed at an angle of about 120 degrees to about 180 degrees circumferentially around the lift pin.

9. The lift pin assembly of claim 1, further comprising a hoop assembly disposed below the purge cylinder.

10. The lift pin assembly of claim 9, wherein the lift pin guide is disposed between the purge cylinder and the hoop assembly.

11. An assembly comprising:
a substrate support;
a facility plate disposed below the substrate support; and
a lift pin assembly disposed within the substrate support and the facility plate comprising:
a lift pin guide;
a purge cylinder disposed adjacent the lift pin guide, the lift pin guide and the purge cylinder having a passage formed therethrough, wherein the purge cylinder comprises:
a plurality of nozzles configured to direct a flow of gas radially inward into a portion of the passage disposed in the purge cylinder, each nozzle included in the plurality of nozzles having an outer diameter of about 20 mil to about 80 mil to reduce particle deposition on a substrate;
a lift pin disposed in the passage; and a bushing, wherein the lift pin guide is disposed between the purge cylinder and the bushing.

12. The lift pin assembly of claim 11, wherein the lift pin is fabricated from sapphire.

13. The lift pin assembly of claim 11, wherein the plurality of nozzles are disposed in a staggered pattern surrounding the lift pin.

14. The lift pin assembly of claim 11, wherein the purge cylinder is a ceramic material.

15. The lift pin assembly of claim 11, wherein the plurality of nozzles are disposed radially outward from the lift pin.

16. The lift pin assembly of claim 11, wherein the lift pin guide is disposed below the purge cylinder.

17. The lift pin assembly of claim 11, wherein the plurality of nozzles comprise at least two nozzles that are disposed at an angle of about 120 degrees to about 180 degrees circumferentially around the lift pin.

18. The lift pin assembly of claim 11, further comprising a hoop assembly disposed below the purge cylinder.

19. The lift pin assembly of claim 18, wherein the lift pin guide is disposed between the purge cylinder and the hoop assembly.

20. A lift pin assembly comprising:
a lift pin configured to lift a substrate;
a lift pin guide;
a purge cylinder disposed adjacent the lift pin guide, the lift pin guide and the purge cylinder having a passage formed therethrough, wherein the lift pin guide is disposed below the purge cylinder, and wherein the purge cylinder comprises:
a plurality of nozzles configured to direct a flow of gas radially inward into a portion of the passage disposed in the purge cylinder, each nozzle included in the plurality of nozzles having an outer diameter of about 20 mil to about 80 mil to reduce particle deposition on the substrate,
wherein the lift pin is disposed in the passage; and
a bushing, wherein the lift pin guide is disposed between the purge cylinder and the bushing.

\* \* \* \* \*